(12) United States Patent
Kim et al.

(10) Patent No.: US 10,700,133 B2
(45) Date of Patent: *Jun. 30, 2020

(54) ORGANIC LIGHT EMITTING DISPLAY

(71) Applicant: SAMSUNG SDI CO., LTD., Yongin-si, Gyeonggi-do (KR)

(72) Inventors: Hye Jin Kim, Suwon-si (KR); Sung Min Ko, Suwon-si (KR); Mi Sun Kim, Suwon-si (KR); Seong Ryong Nam, Suwon-si (KR); Ji Yeon Lee, Suwon-si (KR); Mi Jeong Choi, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 170 days.

This patent is subject to a terminal disclaimer.

(21) Appl. No.: 15/576,936

(22) PCT Filed: May 2, 2016

(86) PCT No.: PCT/KR2016/004595
§ 371 (c)(1),
(2) Date: Nov. 27, 2017

(87) PCT Pub. No.: WO2016/204399
PCT Pub. Date: Dec. 22, 2016

(65) Prior Publication Data
US 2018/0158880 A1   Jun. 7, 2018

(30) Foreign Application Priority Data

Jun. 19, 2015  (KR) .................. 10-2015-0087820

(51) Int. Cl.
*H01L 27/32*   (2006.01)
*H01L 51/52*   (2006.01)
(Continued)

(52) U.S. Cl.
CPC .......... *H01L 27/3209* (2013.01); *B32B 27/08* (2013.01); *H01L 23/293* (2013.01);
(Continued)

(58) Field of Classification Search
None
See application file for complete search history.

(56) References Cited

U.S. PATENT DOCUMENTS

2003/0198830 A1  10/2003  Kim et al.
2006/0063015 A1   3/2006  McCormick et al.
(Continued)

FOREIGN PATENT DOCUMENTS

CN    103906624 A    7/2014
CN    104375380 A    2/2015
(Continued)

OTHER PUBLICATIONS

U.S. Office Action in U.S. Appl. No. 15/576,928 dated Feb. 25, 2019.
(Continued)

*Primary Examiner* — Ramsey Zacharia
(74) *Attorney, Agent, or Firm* — Lee IP Law, PC

(57) ABSTRACT

Disclosed is an organic light emitting diode display apparatus including: a substrate; an organic light emitting diode disposed on the substrate; and an encapsulation layer encapsulating the organic light emitting diode. The encapsulation layer has a structure in which two or more inorganic layers and one or more organic layers are alternately stacked one above another, two adjacent inorganic layers at least partially contact each other, and the organic layers are formed of an encapsulating composition. The encapsulating composition includes a photocurable monomer and a photopolymerization initiator. The photocurable monomer includes a monomer containing no aromatic hydrocarbon group; and a
(Continued)

monomer having two or more substituted or unsubstituted phenyl groups represented by Formula 1. The photocurable monomer includes about 5 wt % to about 45 wt % of the monomer having two or more substituted or unsubstituted phenyl groups and about 55 wt % to about 95 wt % of the monomer containing no aromatic hydrocarbon group.

16 Claims, 1 Drawing Sheet

(51) Int. Cl.
*H01L 51/54* (2006.01)
*H01L 23/29* (2006.01)
*B32B 27/08* (2006.01)

(52) U.S. Cl.
CPC ...... *H01L 27/3297* (2013.01); *H01L 51/5237* (2013.01); *H01L 51/5256* (2013.01); *H01L 51/5262* (2013.01)

(56) References Cited

U.S. PATENT DOCUMENTS

| | | |
|---|---|---|
| 2006/0216951 A1 | 9/2006 | Moro et al. |
| 2008/0238301 A1 | 10/2008 | Shim et al. |
| 2009/0143505 A1 | 6/2009 | Samukawa et al. |
| 2011/0171764 A1* | 7/2011 | Toonen ............... B82Y 20/00 438/29 |
| 2013/0207083 A1 | 8/2013 | Young et al. |
| 2014/0145154 A1 | 5/2014 | Kim et al. |
| 2015/0060797 A1 | 3/2015 | Lee et al. |
| 2015/0252125 A1 | 9/2015 | Moro et al. |
| 2018/0090714 A1 | 3/2018 | Kim et al. |
| 2018/0158880 A1 | 6/2018 | Kim et al. |

FOREIGN PATENT DOCUMENTS

| | | | |
|---|---|---|---|
| CN | 105051082 A | | 11/2015 |
| CN | 105073800 A | | 11/2015 |
| JP | 2014-193970 A | † | 10/2014 |
| JP | 2014193970 A | | 10/2014 |
| KR | 20110071039 A | | 6/2011 |
| KR | 20140066552 A | | 6/2014 |
| KR | 20140066748 A | | 6/2014 |
| KR | 20140091414 A | | 7/2014 |
| KR | 20140115883 A | | 10/2014 |
| KR | 10-2014-0140769 A | † | 12/2014 |
| KR | 10-2014-0140769 A | | 12/2014 |
| KR | 20140140769 A | | 12/2014 |
| KR | 20150019196 A | | 2/2015 |
| KR | 20150026356 A | | 3/2015 |
| KR | 10-2015-0049990 A | † | 5/2015 |
| TW | 201001780 A | | 1/2010 |
| TW | 201347261 A | | 11/2013 |

OTHER PUBLICATIONS

"Aluminum oxide, aluminum oxide refractive index," 2 pages with English translation, Mar. 13, 2015, Filmetrics, Inc., Japan, https://www.filmetricsinc.jp/refractive-index-database/ AI2O3/Aluminium-Oxide.

Difference in refractive index due to coloration, 4 pages with English translation, Sep. 25, 2015, Shimadzu, Japan, https://www.shimadzu.co.jp/opt/products/ref/ref-app03.htmI.

U.S. Office Action in U.S. Appl. No. 15/576,928 dated Aug. 1, 2019.

Third party submission under 1.290, received in U.S. Appl. No. 15/576,928, received Feb. 27, 2019.

U.S. Office Action in U.S. Appl. No. 15/576,928 dated Dec. 31, 2019.

"Photo curable monomers/oligomers, 2.2 Bis(4-(Methacryloxy Ethoxy)Phenyl)Propane(E02.6mol) (E02.6mol)," 7 pages with English translation, Nov. 14, 2009, Shin-Nakamura Chemical Co., Ltd, Japan, http://www.shin-nakamura.com/products/monomer-oligomer-05.html.†

* cited by examiner
† cited by third party

[Figure 1]
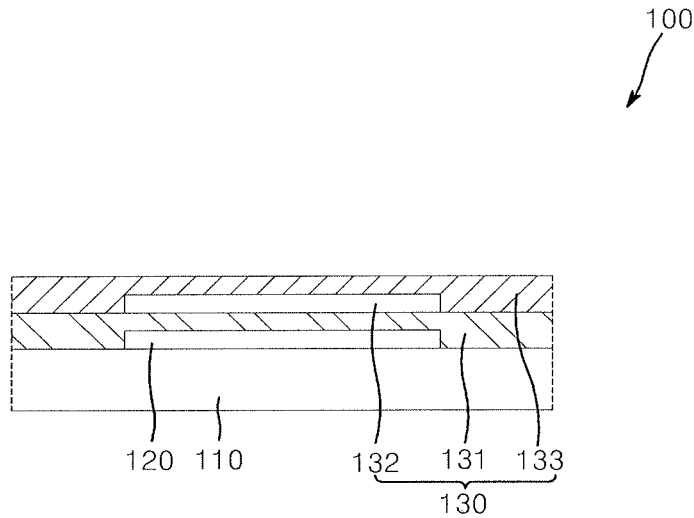
[Figure 2]
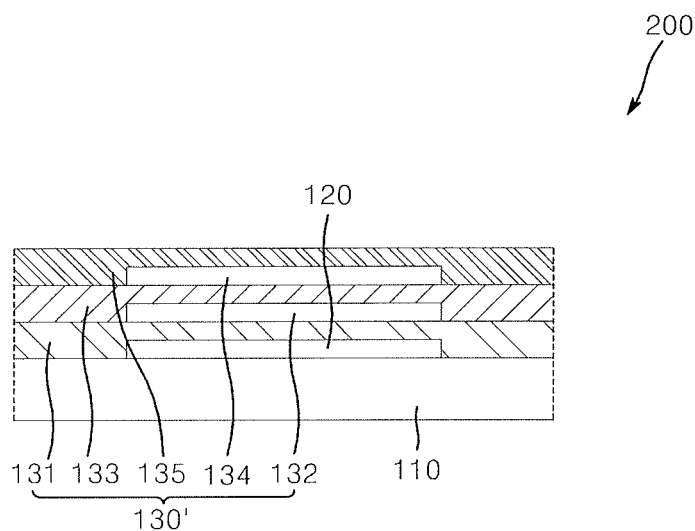

ORGANIC LIGHT EMITTING DISPLAY

CROSS REFERENCE TO RELATED APPLICATIONS

This is the U.S. national phase application based on PCT Application No. PCT/KR2016/004595, filed May 2, 2016, which is based on Korean Patent Application No. 10-2015-0087820, filed Jun. 19, 2015, the entire contents of all of which are hereby incorporated by reference.

TECHNICAL FIELD

The present invention relates to an organic light emitting diode display apparatus.

BACKGROUND ART

Organic light emitting diodes are vulnerable to moisture and/or gas. Organic light emitting diodes can suffer from delamination at an interface between a metal field and a light emitting layer due to moisture. The organic light emitting diodes can have high resistance due to oxidation of metals and can suffer from degradation of organic materials in the light emitting layer due to moisture and/or oxygen. The organic light emitting diode can suffer from deterioration in light emission due to oxidation of the light emitting layer or the metal field by outgassing inside or outside the organic light emitting diodes. Thus, the organic light emitting diode must be encapsulated by an encapsulation composition capable of protecting the organic light emitting diode from moisture and/or gas.

The organic light emitting diode can be encapsulated by an encapsulation layer having a multilayer structure in which organic layers and inorganic layers are alternately stacked one above another. The organic layers can be formed by plasma deposition. However, the organic layers can be etched by plasma. Etching of the organic layers can deteriorate an encapsulation function of the organic layers and provide adverse influence on formation of the inorganic layers. Each of the organic layers is formed between two adjacent inorganic layers. If the organic layers exhibit low resistance to plasma, there can be difficulty in formation of the inorganic layers. As a result, the organic light emitting diode can suffer from deterioration in luminous characteristics and reliability.

The encapsulation layer includes a plurality of inorganic layers on a substrate. Thus, the encapsulation layer can suffer from slight lifting between the inorganic layers and/or delamination or slight lifting between the substrate and the inorganic layer. As a result, the inorganic layers cannot sufficiently prevent moisture and/or oxygen from penetrating the organic light emitting diode.

The background technique of the present invention is disclosed in Korean Patent Laid-open Publication No. 2011-0071039.

DISCLOSURE

Technical Problem

It is one aspect of the present invention to provide an organic light emitting diode display apparatus that includes an organic layer exhibiting high plasma resistance.

It is another aspect of the present invention to provide an organic light emitting diode display apparatus that includes an organic layer having considerably low water vapor permeability and oxygen permeability.

It is a further aspect of the present invention to provide an organic light emitting diode display apparatus that includes an organic layer exhibiting excellent transparency.

It is yet another aspect of the present invention to provide an organic light emitting diode display apparatus that includes an organic layer having low surface roughness to provide excellent surface flatness.

It is yet another aspect of the present invention to provide an organic light emitting diode display apparatus that includes an organic layer capable of securing reliability in elapsed time by protecting the organic light emitting diode display apparatus from surroundings including moisture and gas.

It is yet another aspect of the present invention to provide an organic light emitting diode display apparatus, in which an organic layer more vulnerable to moisture and/or oxygen than an inorganic layer is formed so as not to be exposed at an edge of the encapsulation layer, thereby improving reliability in elapsed time.

It is yet another aspect of the present invention to provide an organic light emitting diode display apparatus, in which two adjacent inorganic layers are formed to contact each other to prevent slight lifting and/or delamination between the inorganic layers or between a substrate and an inorganic layer, thereby suppressing permeation of moisture and/or oxygen into the encapsulation layer through an edge thereof.

Technical Solution

In accordance with one aspect of the present invention, an organic light emitting diode display apparatus includes: a substrate; an organic light emitting diode disposed on the substrate; and an encapsulation layer encapsulating the organic light emitting diode, wherein the encapsulation layer has a structure in which two or more inorganic layers and one or more organic layers are alternately stacked one above another, two adjacent inorganic layers at least partially contact each other, and the organic layers are formed of an encapsulating composition, and wherein the encapsulating composition includes: a photocurable monomer and a photopolymerization initiator, the photocurable monomer including a monomer containing no aromatic hydrocarbon group; and a monomer having two or more substituted or unsubstituted phenyl groups represented by Formula 1, the photocurable monomer comprising 5 wt % to 45 wt % of the monomer having two or more substituted or unsubstituted phenyl groups and 55 wt % to 95 wt % of the monomer containing no aromatic hydrocarbon group.

<Formula 1>

(wherein A, $Z^1$, $Z^2$, a and b are the same as defined in the following detailed description.)

Advantageous Effects

The present invention provides an organic light emitting diode display apparatus that includes an organic layer exhibiting high plasma resistance.

The present invention provides an organic light emitting diode display apparatus that includes an organic layer having considerably low water vapor permeability and oxygen permeability.

The present invention provides an organic light emitting diode display apparatus that includes an organic layer exhibiting excellent transparency.

The present invention provides an organic light emitting diode display apparatus that includes an organic layer having low surface roughness to provide excellent surface flatness.

The present invention provides an organic light emitting diode display apparatus that includes an organic layer capable of securing reliability in elapsed time by protecting the organic light emitting diode display apparatus from surroundings including moisture and gas.

The present invention provides an organic light emitting diode display apparatus, in which an organic layer more vulnerable to moisture and/or oxygen than an inorganic layer is formed so as not to be exposed at an edge of an encapsulation layer, thereby improving reliability in elapsed time.

The present invention provides an organic light emitting diode display apparatus, in which two adjacent inorganic layers are formed to contact each other to prevent slight lifting and/or delamination between the inorganic layers or between a substrate and an inorganic layer, thereby suppressing permeation of moisture and/or oxygen into an encapsulation layer through an edge thereof.

DESCRIPTION OF DRAWINGS

FIG. 1 is a sectional view of an organic light emitting diode display apparatus in accordance with one embodiment of the present invention.

FIG. 2 is a sectional view of an organic light emitting diode display apparatus in accordance with another embodiment of the present invention.

BEST MODE

Hereinafter, embodiments of the present invention will be described in detail with reference to the accompanying drawings. It should be understood that the present invention is not limited to the following embodiments and may be embodied in different ways, and that the following embodiments are given to provide complete disclosure of the invention and to provide a thorough understanding of the invention to those skilled in the art. It should be noted that the drawings are not to precise scale and some of the dimensions, such as width, length, thickness, and the like, are exaggerated for clarity of description in the drawings. Further, although only a portion of a component is illustrated for convenience of description, other portions of the component can become apparent to those skilled in the art. Furthermore, it should be understood that the present invention can be realized in various ways by those skilled in the art without departing from the spirit and scope of the invention.

As used herein, spatially relative terms such as "upper" and "lower" are defined with reference to the accompanying drawings. Thus, it will be understood that "upper" can be used interchangeably with "lower". It will be understood that when a layer is referred to as being "on" another layer, it can be directly formed on the other layer, or intervening layer(s) may also be present. Thus, it will be understood that when a layer is referred to as being "directly on" another layer, no intervening layer is interposed therebetween.

As used herein, the term "(meth)acryl" refers to acryl and/or methacryl.

Unless otherwise defined herein, the term "substituted" means that at least one hydrogen atom in a functional group is substituted with a hydroxyl group, a nitro group, an imino group (=NH, =NR, R being a $C_1$ to $C_{10}$ alkyl group), an amidino group, a hydrazine group, a hydrazone group, a carboxyl group, a $C_1$ to $C_{20}$ alkyl group, a $C_6$ to $C_{30}$ aryl group, a $C_3$ to $C_{30}$ heteroaryl group, or a $C_2$ to $C_{30}$ heterocycloalkyl group.

As used herein, the term "hetero atom" means one atom selected from the group consisting of N, O, S and P, and the term "hetero" means that a carbon atom is substituted with one atom selected from the group consisting of N, O, S and P.

As used herein, the term "plasma resistance" can be determined based on an etching rate upon plasma treatment of a cured product of an encapsulating composition and a lower etching rate indicates better plasma resistance.

As used herein, the term "alkylene group" means alkanediyl groups linked to each other via saturated hydrocarbon without a double bond and having two link groups.

As used herein, the term "alkoxylene group" means an "—OR—" structure having two link groups, wherein R means an alkylene group.

As used herein, the terms "encapsulation" and "seal" refer to surrounding an organic light emitting element and the terms have substantially the same meaning with each other.

An organic light emitting diode display apparatus according to the present invention includes a substrate, an organic light emitting diode disposed on the substrate, and an encapsulation layer encapsulating the organic light emitting diode, wherein the encapsulation layer has a structure in which two or more inorganic layers and one or more organic layers are alternately stacked one above another, two adjacent inorganic layers at least partially contact each other, and the organic layers are formed of an encapsulating composition according to the present invention.

The encapsulating composition according to the present invention can realize an organic layer that has excellent plasma resistance, and has low roughness to secure excellent flatness. Accordingly, in the organic light emitting diode display apparatus according to the present invention, such an organic layer is formed between the inorganic layers to provide a flat encapsulation layer, thereby realizing a thin thickness of the encapsulation layer.

The encapsulating composition according to the present invention can realize an organic layer exhibiting significantly low water vapor permeability and oxygen permeability. Accordingly, the organic light emitting diode display apparatus according to the present invention can further prevent corrosion and deterioration in luminous efficiency of the organic light emitting diode due to permeation of external moisture and/or oxygen while improving reliability of the organic light emitting diode in elapsed time.

In the encapsulation layer according to the present invention, two adjacent inorganic layers may at least partially contact each other. Accordingly, the organic light emitting diode display apparatus according to the present invention can further suppress permeation of moisture and/or oxygen into the inorganic layers and can suppress delamination or slight lifting between the inorganic layers.

For example, in the organic light emitting diode display apparatus according to the present invention, the inorganic layers include a first inorganic layer and a second inorganic layer; the organic layer includes a first organic layer; and the encapsulation layer includes the first inorganic layer, the first organic layer, and the second inorganic layer alternately stacked one above another.

The encapsulation layer may have a structure wherein the first inorganic layer and the second inorganic layer are sequentially stacked at an edge thereof.

In some embodiments, the encapsulation layer may have a structure wherein the first inorganic layer and the second inorganic layer are sequentially stacked at an edge thereof. In these embodiments, the second inorganic layer may have an upper surface, a lower surface, or an edge contacting the first inorganic layer.

In one embodiment, the first inorganic layer and the second inorganic layer may have the same area. In another embodiment, the second inorganic layer may be formed to surround the first organic layer. In other embodiments, the inorganic layers may have the same area or may have a gradually increasing area with increasing distance from the organic light emitting diode.

Next, an organic light emitting diode display apparatus according to one embodiment will be described with reference to FIG. 1. FIG. 1 is a partially sectional view of an organic light emitting diode display apparatus in accordance with one embodiment of the invention.

Referring to FIG. 1, an organic light emitting diode display apparatus 100 according to one embodiment includes a substrate 110, an organic light emitting diode 120, and an encapsulation layer 130, which can encapsulate the organic light emitting diode 120.

The substrate 110 may be disposed under the organic light emitting diode 120 and the encapsulation layer 130 to support the organic light emitting diode 120 and the encapsulation layer 130. The substrate 110 may include a luminous region in which the organic light emitting diode 120 is formed, and a non-luminous region corresponding to a region excluding the luminous region.

The substrate 110 may be a glass substrate, a quartz substrate or a transparent plastic substrate. The transparent plastic substrate may be applied to flexible products by providing flexibility to the organic light emitting diode display apparatus. The transparent plastic substrate may be formed of at least one among polyimide resins, acrylic resins, polyacrylate resins, polycarbonate resins, polyether resins, polyester resins including polyethylene terephthalate, and sulfonic acid resins, without being limited thereto.

The organic light emitting diode 120 may be formed on the luminous region of the substrate 110 to drive the organic light emitting diode display apparatus. The organic light emitting diode is a self-emissive device and may include a typical structure publicly known in the art.

Specifically, the organic light emitting diode may have a structure wherein an anode, a hole transport region, a light emitting layer, an electron transport region, and a cathode are sequentially stacked in this order. The hole transport region may include at least one of a hole injection layer, a hole transport layer and an electron blocking layer. The electron transport region may include at least one of a hole blocking layer, an electron transport layer and an electron injection layer. Light is emitted from the light emitting layer through recombination of holes generated from the anode and electrons generated from the cathode in the light emitting layer. Details of the anode, the hole transport region, the light emitting layer, the electron transport region, and the cathode are well known to those skilled in the art.

Specifically, the anode may be formed of a material having high work function to allow efficient injection of holes into the light emitting layer. Examples of materials for the anode may include metals such as nickel, platinum, vanadium, chromium, copper, zinc, and gold, metal alloys thereof, metal oxides such as zinc oxide, indium oxide, indium tin oxide, and indium zinc oxide, combinations of metals and metal oxides, such as a combination of zinc oxide and aluminum, a combination of zinc oxide and antimony.

The cathode may be formed of a material having low work function to allow easy injection of electrons into an organic light emitting layer. Examples of materials for the cathode may include metals such as magnesium, calcium, sodium, potassium, titanium, indium, yttrium, lithium, gadolinium, aluminum, silver, tin, lead, cesium, barium, or metal alloys thereof.

The light emitting layer may include a material known to those skilled in the art. For example, the light emitting layer may include fluorine derivatives and metal complexes, without being limited thereto.

The hole transport region may be formed of materials such as m-MTDATA, TDATA, 2-TNATA, NPB, β-NPB, TPD, Spiro-TPD, Spiro-NPB, α-NPB, TAPC, HMTPD, PEDOTT/PSS (poly(3,4-ethylenedioxythiophene)/poly(4-styrenesulfonate), and PANI/PSS (polyaniline/poly(4-styrenesulfonate) as follows, without being limited thereto.

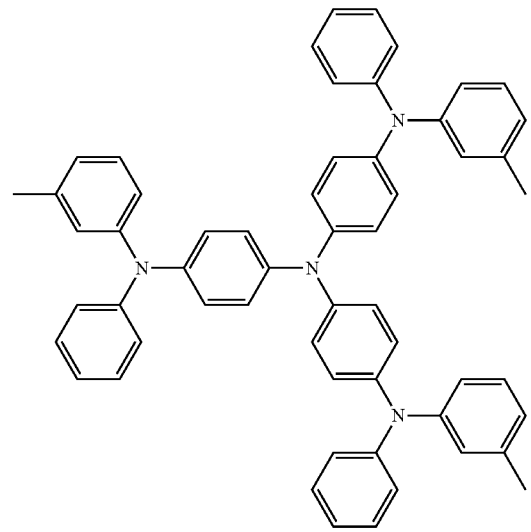

m-MTDATA

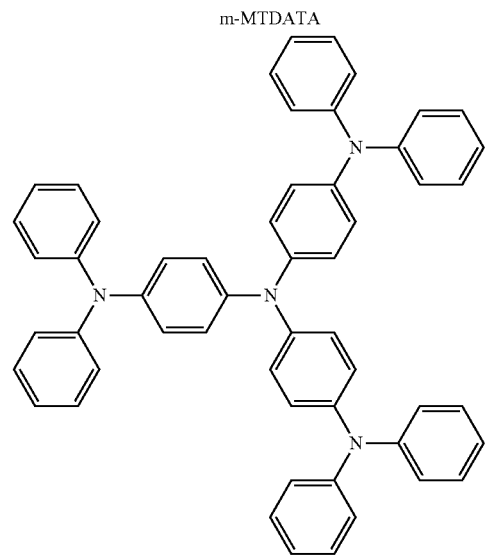

TDATA

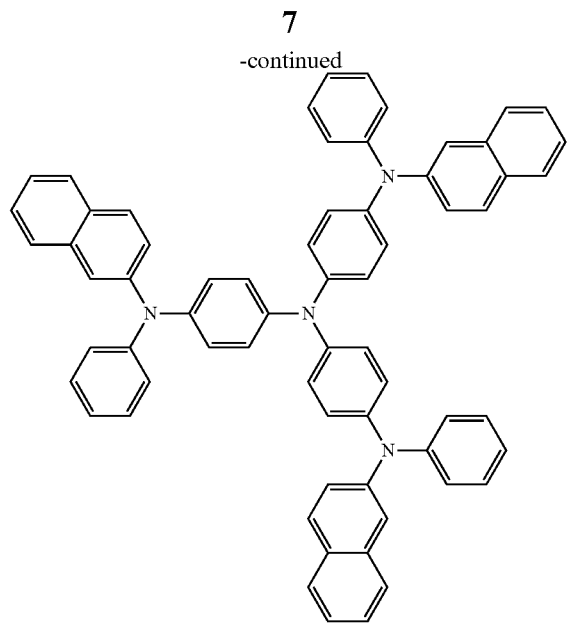
2-TNATA
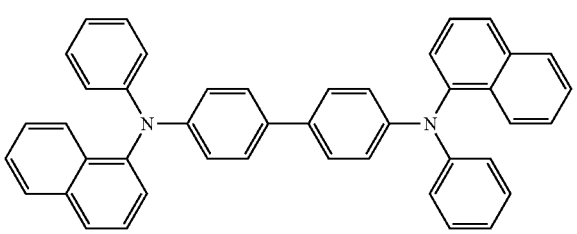
NPB
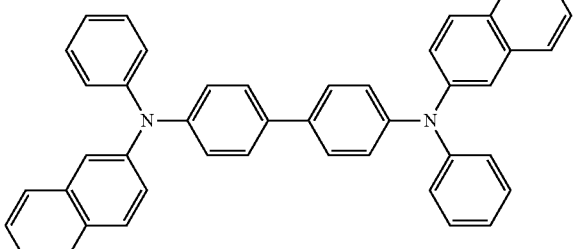
β-NPB
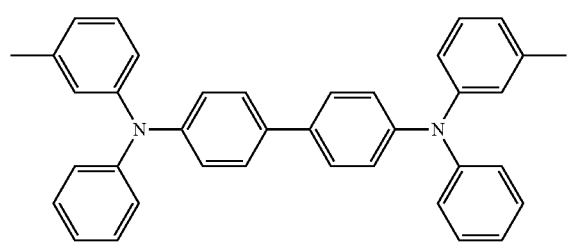
TPD
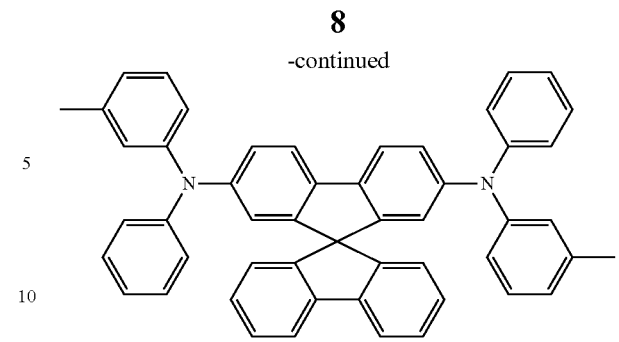
Spiro-TPD
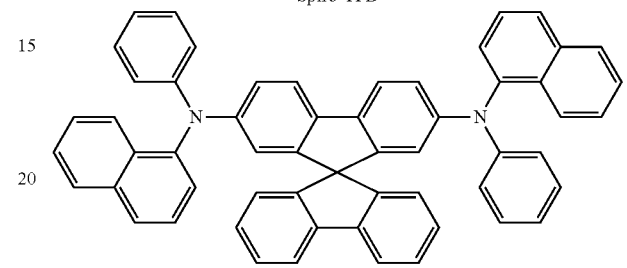
Spiro-NPD
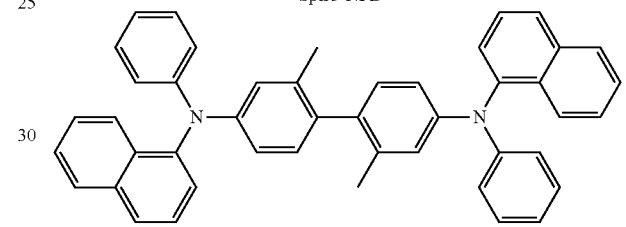
α-NPB
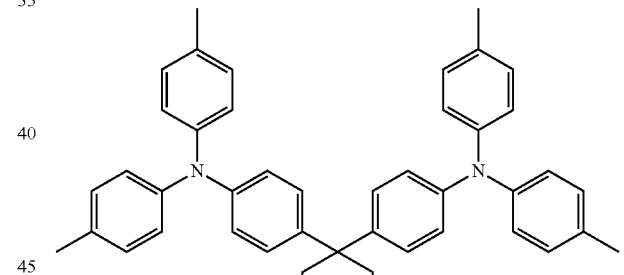
TAPC
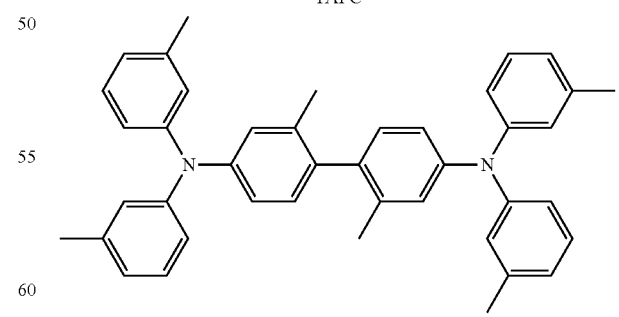
HMTPD
In the electron transport region, the hole blocking layer may include at least one of BCP and Bphen as follows, without being limited thereto.

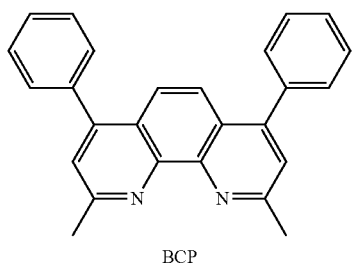

BCP

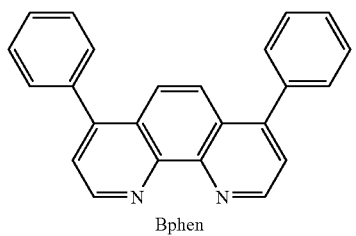

Bphen

The electron transport layer may include at least one of BCP and Bphen as above, and Alq₃, BAlq, TAZ, NTAZ, ET1, and ET2 as follows, without being limited thereto.

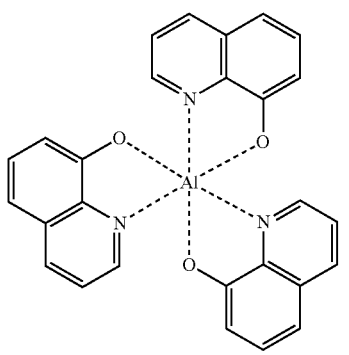

Alq₃

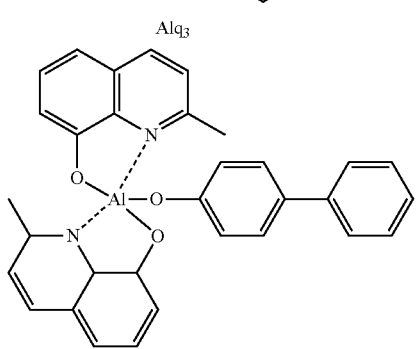

BAlq

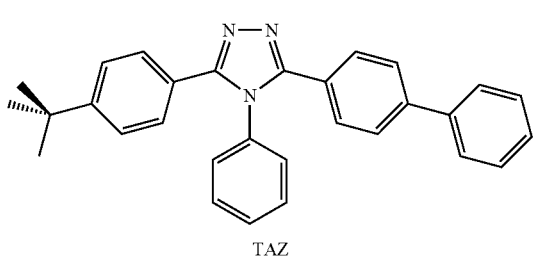

TAZ

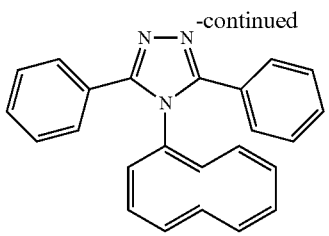

NTAZ

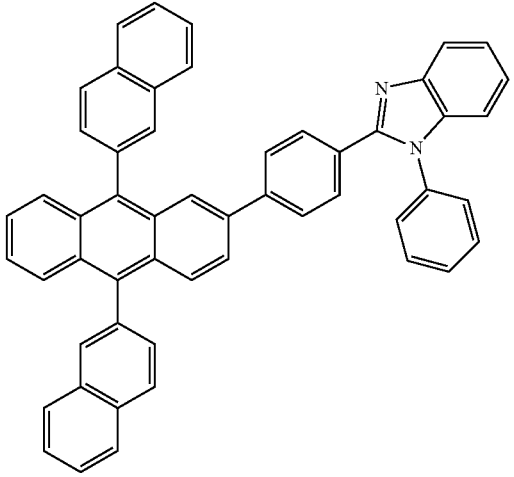

ET1

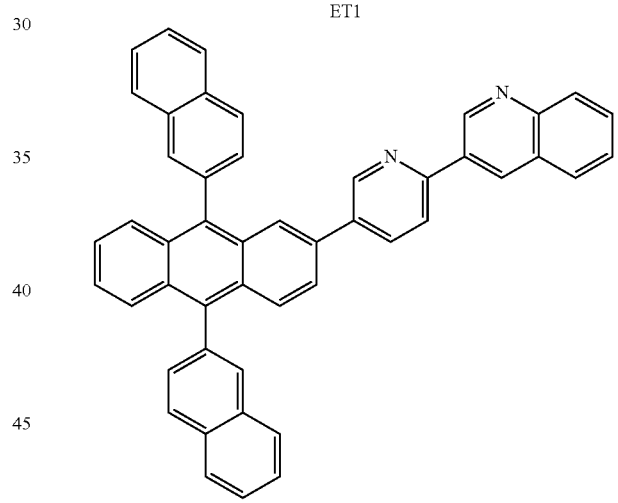

ET2

The electron injection layer may include at least one of LiF, NaCl, CsF, Li₂O, and BaO, without being limited thereto:

The encapsulation layer may be directly formed on the organic light emitting diode 120 to encapsulate the organic light emitting diode 120. Herein, the expression "directly formed on" means that no adhesive layer, bonding layer and/or air layer is interposed between the encapsulation layer and the organic light emitting diode.

The encapsulation layer 130 may be directly formed on the organic light emitting diode 120 to encapsulate the organic light emitting diode 120. Herein, the expression "directly formed on" means that no adhesive layer, bonding layer and/or air layer is interposed between the encapsulation layer 130 and the organic light emitting diode 120.

The encapsulation layer 130 may have a multilayer structure in which two or more inorganic layers and one or more organic layers are alternately stacked one above another. FIG. 1 shows an organic light emitting diode display apparatus including an encapsulation layer in which two inorganic layers and one organic layer are alternately stacked in a total of three layers. Specifically, FIG. 1 shows an organic light emitting diode display apparatus including an encapsulation layer in which a first inorganic layer 131, a first organic layer 132, and a second inorganic layer 133 are alternately stacked. In other embodiments, the encapsulation layer may have other types of multilayer structure in which the inorganic layers and the organic layers are alternately stacked in a total of 5 to 15 layers, specifically, 5 layers, to 7 layers. For example, in the structure wherein the encapsulation layer includes a total of 5 layers, the encapsulation layer may include a first inorganic layer, a first organic layer, a second inorganic layer, a second organic layer, and a third inorganic layer alternately stacked one above another. In the structure wherein the encapsulation layer includes a total of 7 layers, the encapsulation layer may include a first inorganic layer, a first organic layer, a second inorganic layer, a second organic layer, a third inorganic layer, a third organic layer, and a fourth inorganic layer alternately staked one above another. Generally, the outermost layer of the encapsulation layer may be an inorganic layer. With this structure, the organic light emitting diode display apparatus can facilitate maintenance and processability.

Referring to FIG. 1, the structure of the encapsulation layer wherein the inorganic layers include the first inorganic layer 131 and the second inorganic layer 133, and the organic layer includes the first organic layer 132 will be described in more detail.

Each of the first inorganic layer 131 and the second inorganic layer 133 has a different composition than the first organic layer 132 and can compensate for effects of the first organic layer 132. Each of the first and second inorganic layers 131, 133 can suppress permeation of oxygen or moisture into the organic light emitting diode 120.

The first inorganic layer 131 is formed to directly contact the organic light emitting diode 120 and the substrate 110. With this structure, the first inorganic layer 131 can suppress permeation of external moisture and/or oxygen into the organic light emitting diode 120. As used herein, the expression "formed to directly contact" means that no adhesive layer, bonding layer and/or air layer is interposed between the organic light emitting diode 120 and the first inorganic layer 131.

The second inorganic layer 133 is directly formed on the first organic layer 132. The first organic layer 132 has high plasma resistance and low surface roughness. Accordingly, the second inorganic layer 133 can secure a uniform thickness and the encapsulation layer 130 can secure uniform surface roughness.

The second inorganic layer 133 is formed to at least partially contact the first inorganic layer 131. Thus, the encapsulation layer 130 may have a structure wherein the first inorganic layer 131 and the second inorganic layer 133 are sequentially stacked on the substrate 110. With this structure, the encapsulation layer 130 can further suppress permeation of external moisture and/or oxygen into the organic light emitting diode 120 while further improving encapsulation functions at side surfaces of the organic light emitting diode 120. Furthermore, the encapsulation layer 130 can improve reliability of the organic light emitting diode 120 by preventing slight lifting and/or delamination between the first inorganic layer 131 and the second inorganic layer 133. Referring to FIG. 1, the encapsulation layer 130 has a structure wherein the first inorganic layer 131 and the second inorganic layer 133 are sequentially stacked at an edge thereof.

The second inorganic layer 133 has a lower surface contacting the first inorganic layer 131. With this structure, a contact area between the first inorganic layer 131 and the second inorganic layer 133 is enlarged, thereby further improving encapsulation effects. In some embodiments, the second inorganic layer 133 may be formed to contact the first inorganic layer 131 at an edge of the second inorganic layer 133, particularly, a thickness portion or an upper surface of the second inorganic layer 133.

The second inorganic layer 133 surrounds the first organic layer 132 and is sequentially stacked on the first inorganic layer 131. In this structure, the first inorganic layer 131 has the same area as the second inorganic layer 133. Alternatively, the second inorganic layer 133 may be formed to surround both the first organic layer 132 and the first inorganic layer 131. Alternatively, the inorganic layers may have a gradually increasing area with increasing distance from the organic light emitting diode 120. With this structure, the encapsulation layer 130 can suppress permeation of external moisture and/or oxygen into the organic light emitting diode 120 while further suppressing delamination and/or slight lifting between the first inorganic layer 131 and the second inorganic layer 133.

Each of the first inorganic layer 131 and the second inorganic layer 133 may be formed of an inorganic material having excellent light transmittance. The first inorganic layer 131 and the second inorganic layer 133 may be formed of the same or different inorganic materials. Specifically, the inorganic materials may include metals, nonmetals, intermetallic compounds or alloys, inter non-metallic compounds or alloys, oxides of metals or nonmetals, fluorides of metals or nonmetals, nitrides of metals or nonmetals, carbides of metals or nonmetals, oxynitrides of metals or nonmetals, borides of metals or nonmetals, oxyborides of metals or nonmetals, silicides of metals or nonmetals, and mixtures thereof. The metals or nonmetals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the inorganic materials may include silicon oxide ($SiO_x$), silicon nitride ($SiN_x$), silicon oxynitride ($SiO_xN_y$), ZnSe, ZnO, $Sb_2O_3$, $AlO_x$ including $Al_2O_3$, $In_2O_3$, or $SnO_2$. Here, each of x and y ranges from 1 to 5.

The first and second inorganic layers 131, 133 may have the same or different thicknesses. Specifically, each of the first inorganic layer 131 and the second inorganic layer 133 may have a thickness of about 40 nm to about 1000 nm, more specifically about 100 nm to about 1000 nm. Within this thickness range, the first and second inorganic layers 131, 133 can block permeation of moisture and oxygen.

The first organic layer 132 may be disposed inside a region defined between the first inorganic layer 131 and the second inorganic layer 133. That is, the first organic layer 132 may be completely surrounded by the first inorganic layer 131 and the second inorganic layer 133. The first organic layer 132 may be formed of an encapsulating composition according to the present invention. Accordingly, the first organic layer 132 can realize an effect of blocking permeation of external moisture and oxygen by blocking defects of the inorganic layers while flattening the inorganic layers.

FIG. 1 shows the structure wherein the encapsulation layer 130 includes only the first organic layer 132 as an organic layer. In another embodiment, the encapsulation layer 130 may further include a second organic layer and a third inorganic layer sequentially formed on the second inorganic layer 133. In this embodiment, the first organic layer 132 and the second organic layer may have the same area. Alternatively, the second organic layer may have a larger area than the first organic layer. That is, the organic layers may have the same area or a gradually increasing area with increasing distance from the organic light emitting diode 120.

The first organic layer 132 may have a thickness of about 0.2 μm to about 15 μm, specifically about 1 μm, to about 15 μm. Within this thickness range, the first organic layer can realize an effect of blocking permeation of external moisture and oxygen by blocking defects of the inorganic layer while flattening the inorganic layer.

The first organic layer 132 may be formed of an encapsulating composition according to embodiments of the present invention. Thus, the organic layer according to the embodiments of the invention can secure reliability of the organic light emitting diode display apparatus 100 in elapsed time by protecting the organic light emitting diode display apparatus from surroundings including moisture and gas.

Next, an encapsulating composition according to embodiments of the present invention will be described.

The encapsulating composition may include a photocurable monomer and a photopolymerization initiator.

As used herein, the photocurable monomer means a photocurable monomer that can perform curing reaction initiated by the photopolymerization initiator. The photocurable monomer may employ a non-silicon monomer which does not include silicon (Si). For example, the photocurable monomer may consist of elements selected from C, H, O, N and S, without being limited thereto. The photocurable monomer may be prepared by a typical preparation method or may be obtained from commercially available products.

The photocurable monomer may include a monomer containing no aromatic hydrocarbon group (non-aromatic hydrocarbon-based monomer); and a monomer having two or more substituted or unsubstituted phenyl groups as represented by Formula 1, wherein the monomer having two or more substituted or unsubstituted phenyl groups may be present in an amount of 5 wt % to 45 wt %, and the monomer containing no aromatic hydrocarbon group may be present in an amount of 55 wt % to 95 wt %.

<Formula 1>

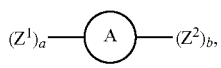

(where in Formula 1, A is a hydrocarbon having two or more substituted or unsubstituted phenyl groups, or a hetero atom-containing hydrocarbon having two or more substituted or unsubstituted phenyl groups;

$Z^1$ and $Z^2$ are each independently a compound represented by Formula 2; and a and b are each independently an integer from 0 to 2 and a+b is an integer from 1 to 4).

<Formula 2>

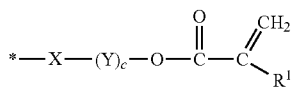

(where in Formula 2, * is a link site to carbon of A in Formula 1;

X is a single bond, O, or S;

Y is a substituted or unsubstituted $C_1$ to $C_{10}$ linear alkylene group or a substituted or unsubstituted $C_1$ to $C_{20}$ alkoxylene group;

$R^1$ is hydrogen or a $C_1$ to $C_5$ alkyl group; and c is 0 or 1).

In Formula 2, the "single bond" means that A of Formula 1 is directly linked to (Y)c without any intervening element.

In Formula 1 and 2, A is a hydrocarbon having two or more substituted or unsubstituted phenyl groups or a hetero atom-containing hydrocarbon having two or more substituted or unsubstituted phenyl groups. The hydrocarbon having two or more substituted or unsubstituted phenyl groups or the hetero atom-containing hydrocarbon having two or more substituted or unsubstituted phenyl groups means that two or more substituted or unsubstituted phenyl groups are linked to each other by a single bond, an oxygen atom, a sulfur atom, a substituted or unsubstituted $C_1$ to $C_5$ alkylene group, a hetero atom-substituted or unsubstituted $C_3$ to $C_6$ alkylene group, an ethenylene group, an ethynylene group or a carbonyl group without condensation. For example, the hydrocarbon having two or more phenyl groups or the hetero atom-containing hydrocarbon having two or more phenyl groups may include a substituted or unsubstituted biphenyl group, a substituted or unsubstituted triphenylmethyl group, a substituted or unsubstituted terphenyl group, a substituted or unsubstituted biphenylene group, a substituted or unsubstituted terphenylene group, a substituted or unsubstituted quaterphenylene group, a substituted or unsubstituted 2-phenyl-2-(phenylthio)ethyl group, a substituted or unsubstituted 2,2-diphenylpropane group, a substituted or unsubstituted diphenylmethane group, a substituted or unsubstituted cumylphenyl group, a substituted or unsubstituted bisphenol F group, a substituted or unsubstituted bisphenol A group, a substituted or unsubstituted biphenyloxy group, a substituted or unsubstituted terphenyloxy group, a substituted or unsubstituted quaterphenyloxy group, a substituted or unsubstituted quinquephenyloxy group, and structural isomers thereof, without being limited thereto.

The monomer having two or more substituted or unsubstituted phenyl groups may be mono(meth)acrylate, di(meth)acrylate, or a mixture thereof. Examples of the monomer having two or more substituted or unsubstituted phenyl groups may include 4-(meth)acryloxy-2-hydroxybenzophenone, ethyl-3,3-diphenyl (meth)acrylate, benzoyloxyphenyl (meth)acrylate, bisphenol A di(meth)acrylate, ethoxylated bisphenol A di(meth)acrylate, bisphenol F di(meth)acrylate, ethoxylated bisphenol F di(meth)acrylate, 4-cumylphenoxyethyl (meth)acrylate, ethoxylated bisphenylfluorene di(meth)acrylate, 2-phenylphenoxyethyl (meth)acrylate, 2,2'-phenylphenoxyethyl di(meth)acrylate, 2-phenylphenoxypropyl (meth)acrylate, 2,2'-phenylphenoxypropyl di(meth)acrylate, 2-phenylphenoxybutyl (meth)acrylate, 2,2'-phenylphenoxybutyl di(meth)acrylate, 2-(3-phenylphenyl)ethyl (meth)acrylate, 2-(4-benzylphenyl)ethyl (meth)acrylate, 2-phenyl-2-(phenylthio)ethyl (meth)acrylate, 2-(triphenylmethyloxy)ethyl (meth)acrylate, 4-(triphenylmethyloxy)butyl (meth)acrylate, 3-(biphenyl-2-yloxy)butyl (meth)acrylate, 2-(biphenyl-2-yloxy)butyl (meth)acrylate, 4-(biphenyl-2-yloxy)propyl (meth)acrylate, 3-(biphenyl-2-yloxy)propyl (meth)acrylate, 2-(biphenyl-2-yloxy)propyl (meth)acrylate, 4-(biphenyl-2-yloxy)ethyl (meth)acrylate, 3-(biphenyl-2-yloxy)ethyl (meth)acrylate, 2-(4-benzylphenyl)ethyl (meth) acrylate, 4,4'-di((meth)acryloyloxymethyl)biphenyl, 2,2'-di (2-(meth)acryloyloxyethoxy)biphenyl, structural isomers and mixtures thereof, without being limited thereto. It should be noted that the aforementioned (meth)acrylates are provided for illustration only and the present invention is not limited thereto and include any acrylates related to structural isomers. For example, although 2,2'-phenylphenoxyethyl di(meth)acrylate is referred to alone herein, the monomer having two or more substituted or unsubstituted phenyl groups includes all structural isomers thereof, such as 3,2'-phenylphenoxyethyl di(meth)acrylate and 3,3'-phenylphenoxyethyl di(meth)acrylate.

In one embodiment, the monomer having two or more substituted or unsubstituted phenyl groups may be a mono (meth)acrylate represented by Formula 3:

<Formula 3>

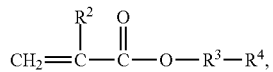

(Where in Formula 3, $R^2$ is hydrogen or a methyl group; $R^3$ is a substituted or unsubstituted $C_1$ to $C_{10}$ linear alkylene group, or a substituted or unsubstituted $C_1$ to $C_{20}$ alkoxylene group; and $R^4$ is a hydrocarbon having two or more substituted or unsubstituted phenyl groups or a hetero atom-containing hydrocarbon having two or more substituted or unsubstituted phenyl groups).

For example, the hydrocarbon having two or more substituted or unsubstituted phenyl groups or the hetero atom-containing hydrocarbon having two or more substituted or unsubstituted phenyl groups means that two or more substituted or unsubstituted phenyl groups are linked to each other by a single bond, an oxygen atom, a sulfur atom, a substituted or unsubstituted $C_1$ to $C_3$ alkylene group, a hetero atom-substituted or unsubstituted $C_3$ to $C_6$ alkylene group, an ethenylene group, an ethynylene group or a carbonyl group without condensation. For example, the hydrocarbon having two or more substituted or unsubstituted phenyl groups or the hetero atom-containing hydrocarbon having two or more substituted or unsubstituted phenyl groups may include a substituted or unsubstituted biphenyl group, a substituted or unsubstituted triphenylmethyl group, a substituted or unsubstituted terphenyl group, a substituted or unsubstituted biphenylene group, a substituted or unsubstituted terphenylene group, a substituted or unsubstituted quaterphenylene group, a substituted or unsubstituted 2-phenyl-2-(phenylthio)ethyl group, a substituted or unsubstituted 2,2-diphenylpropane group, a substituted or unsubstituted diphenylmethane group, a substituted or unsubstituted cumylphenyl group, a substituted or unsubstituted bisphenol F group, a substituted or unsubstituted bisphenol A group, a substituted or unsubstituted biphenyloxy group, a substituted or unsubstituted terphenyloxy group, a substituted or unsubstituted quaterphenyloxy group, and a substituted or unsubstituted quinquephenyloxy group, without being limited thereto.

In one embodiment, the monomer having two or more substituted or unsubstituted phenyl groups may be a di(meth)acrylate represented by Formula 4:

<Formula 4>

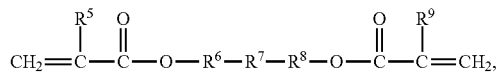

(where in Formula 4, $R^5$ and $R^9$ are each independently hydrogen or a methyl group; $R^6$ and $R^8$ are each independently a substituted or unsubstituted $C_1$ to $C_{10}$ linear alkylene group, or a substituted or unsubstituted $C_1$ to $C_{20}$ alkoxylene group; and $R^7$ is a hydrocarbon having two or more substituted or unsubstituted phenyl groups, or a hetero atom-containing hydrocarbon having two or more substituted or unsubstituted phenyl groups).

For example, the hydrocarbon having two or more substituted or unsubstituted phenyl groups or the hetero atom-containing hydrocarbon having two or more substituted or unsubstituted phenyl groups means that two or more substituted or unsubstituted phenyl groups are linked to each other by a single bond, an oxygen atom, a sulfur atom, a substituted or unsubstituted $C_1$ to $C_4$ alkylene group, a hetero atom-substituted or unsubstituted $C_3$ to $C_6$ alkylene group, an ethenylene group, an ethynylene group or a carbonyl group without condensation. For example, the hydrocarbon may include a substituted or unsubstituted biphenylene group, a substituted or unsubstituted triphenylmethylene group, a substituted or unsubstituted terphenylene group, a substituted or unsubstituted quaterphenylene group, a 2-phenyl-2-(phenylthio)ethylene group, a 2,2-diphenylpropylene group, and a diphenylmethylene group, without being limited thereto.

In Formula 1, a and b are each independently an integer from 0 to 2 and a+b is an integer from 1 to 4. For example, a+b is 1 or 2.

The monomer having two or more substituted or unsubstituted phenyl groups may have a weight average molecular weight of 100 g/mol to 1000 g/mol, 130 g/mol to 700 g/mol, 150 g/mol to 600 g/mol. Within this range, the composition can provide an organic layer which exhibits excellent plasma resistance, low surface roughness and excellent transmittance.

The monomer having two or more substituted or unsubstituted phenyl groups may be present in an amount of about 5 wt % to about 45 wt %, more specifically about 10 wt % to about 40 wt %, based on the total weight of the photocurable monomer. Within this range, the composition exhibits suitable viscosity for formation of an organic layer having excellent plasma resistance.

The monomer containing no aromatic hydrocarbon group does not include an aromatic hydrocarbon group and may include about 1 to about 20, specifically about 1 to about 6 photocurable functional groups, each of which includes at least one of a vinyl group, an acrylate group and a methacrylate group. The non-aromatic hydrocarbon-based monomer may include, for example, about 1 to 3, about 1 to 2, about 1, or about 2 photocurable functional groups.

The monomer containing no aromatic hydrocarbon group may have a weight average molecular weight of about 100 g/mol to about 500 g/mol, about 130 g/mol to about 400 g/mol. Within this range of the weight average molecular weight, the monomer can secure more advantageous effects in terms of process.

The monomer containing no aromatic hydrocarbon group may include a mono-functional monomer, a polyfunctional monomer, or a mixture thereof, which has a photocurable functional group.

The monomer containing no aromatic hydrocarbon group may be a (meth)acrylate monomer. Specifically, the non-aromatic hydrocarbon-based monomer containing no aromatic hydrocarbon group may be unsaturated carboxylic acid esters having a $C_1$ to $C_{20}$ alkyl group, a $C_3$ to $C_{20}$ cycloalkyl group, or a hydroxyl group and a $C_1$ to $C_{20}$ alkyl group; unsaturated carboxylic acid esters having a $C_1$ to $C_{20}$ amino alkyl group; vinyl esters of a $C_1$ to $C_{20}$ saturated or unsaturated carboxylic acid; vinyl cyanide compounds; unsaturated amide compounds; mono-functional or polyfunctional (meth)acrylates of monohydric or polyhydric alcohols, or the like. "Polyhydric alcohols" means alcohols having two or more, 2 to 20, preferably 2 to 10, more preferably 2 to 6 hydroxyl groups.

In one embodiment, the (meth)acrylate monomer containing no aromatic hydrocarbon group may be a mono(meth)acrylate, di(meth)acrylate, tri(meth)acrylate, or tetra(meth)acrylate, which has a substituted or unsubstituted $C_1$ to $C_{20}$ alkyl group, a substituted or unsubstituted $C_1$ to $C_{20}$ alkyl silyl group, a substituted or unsubstituted $C_3$ to $C_{20}$ cycloalkyl group, a substituted or unsubstituted $C_1$ to $C_{20}$ alkylene group, an amine group, or an ethylene oxide group.

Specifically, examples of the (meth)acrylate monomer containing no aromatic hydrocarbon group may include unsaturated carboxylic acid esters containing a (meth)acrylic acid ester, such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decanyl (meth)acrylate, undecanyl (meth)acrylate, dodecyl (meth)acrylate, and cyclohexyl (meth)acrylate; unsaturated carboxylic acid aminoalkyl esters, such as 2-aminoethyl (meth)acrylate and 2-dimethylaminoethyl (meth)acrylate; saturated or unsaturated carboxylic acid vinyl esters such as vinyl acetate; vinyl cyanide compounds such as (meth)acrylonitrile; unsaturated amide compounds such as (meth)acrylamide; ethylene glycol di(meth)acrylate, triethylene glycol di(meth)acrylate, trimethylolpropane tri(meth)acrylate, 1,4-butanediol di(meth)acrylate, 1,6-hexanediol di(meth)acrylate, octanediol di(meth)acrylate, nonanediol di(meth)acrylate, decanediol di(meth)acrylate, undecanediol di(meth)acrylate, dodecanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate or mixtures thereof, without being limited thereto.

In one embodiment, the monomer containing no aromatic hydrocarbon group is a non-aromatic monomer containing no aromatic group and may include at least one or more among a substituted or unsubstituted $C_1$ to $C_{20}$ alkyl group-containing mono(meth)acrylate, an amine group-containing mono(meth)acrylate, a substituted or unsubstituted $C_1$ to $C_{20}$ alkylene group-containing di(meth)acrylate, an ethylene oxide group-containing di(meth)acrylate, an ethylene oxide-containing tri(meth)acrylate, and a trimethylolpropane tri(meth)acrylate.

Examples of the substituted or unsubstituted $C_1$ to $C_{20}$ alkyl group-containing mono(meth)acrylate may include decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, arachidyl (meth)acrylate, and mixtures thereof, without being limited thereto.

Examples of the amine group-containing mono(meth)acrylate may include 2-aminoethyl (meth)acrylate, 2-dimethylaminoethyl (meth)acrylate, or mixtures thereof, without being limited thereto.

The substituted or unsubstituted $C_1$ to $C_{20}$ alkylene group-containing di(meth)acrylate may be, for example, a $C_1$ to $C_{20}$ alkylene group-containing di(meth)acrylate, or may be a substituted or unsubstituted long chain alkylene group-containing non-silicon-based di(meth)acrylate. When the composition includes such a long chain alkylene group-containing non-silicon-based di(meth)acrylate, the composition can facilitate formation of an organic layer on an organic light emitting diode or an inorganic layer encapsulating the organic light emitting diode through deposition or the like. Examples of the substituted or unsubstituted $C_1$ to $C_{20}$ alkylene group-containing di(meth)acrylate may include octanediol di(meth)acrylate, nonanediol di(meth)acrylate, decanediol di(meth)acrylate, undecanediol di(meth)acrylate, dodecanedioldi(meth)acrylate, and mixtures thereof, without being limited thereto. When the composition includes the substituted or unsubstituted $C_1$ to $C_{20}$ alkylene group-containing di(meth)acrylate, the composition can exhibit further improved photocuring rate and low viscosity.

The ethylene oxide containing di(meth)acrylate or tri(meth)acrylate may be, specifically, ethylene glycol di(meth)acrylate, triethylene glycol di(meth)acrylate, or mixtures thereof, without being limited thereto.

The monomer containing no aromatic hydrocarbon group may be present in an amount of about 55 wt % to about 95 wt %, specifically about 60 wt % to about 90 wt %, based on the total weight of the photocurable monomer. Within this content range, the encapsulating composition can have suitable viscosity for formation of an organic layer.

The photocurable monomer and the monomer containing no aromatic hydrocarbon group and the monomer having two or more substituted or unsubstituted phenyl groups represented by formula 1 or 2, may be present in a total amount of about 80 parts by weight to about 99.9 parts by weight based on 100 parts by weight of the photocurable monomer and the photopolymerization initiator in the encapsulating composition. Within this range, the photopolymerization initiator allows sufficient of this invention. Specifically, the total amount of the photocurable monomer and the monomer containing no aromatic hydrocarbon group and the monomer having two or more substituted or unsubstituted phenyl groups represented by formula 1 or 2, may be about 90 parts by weight to about 99.5 parts by weight, more specifically, about 92 parts by weight to about 99 parts by weight.

The photopolymerization initiator can cure the monomer containing no aromatic hydrocarbon group and the monomer having two or more substituted or unsubstituted phenyl groups.

The photopolymerization initiator may include any typical photopolymerization initiator capable of performing photocuring reaction, without limitation. For example, the photopolymerization initiator may include triazine, acetophenone, benzophenone, thioxanthone, benzoin, phosphorus, oxime initiators, and mixtures thereof.

Examples of the triazine initiators may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloro methyl (piperoyl)-6-triazine, 2,4-(trichloromethyl(4'-methoxystyryl)-6-triazine, and mixtures thereof.

Examples of the acetophenone initiators may include 2,2'-diethoxyacetophenone, 2,2'-dibutoxyacetophenone, 2-hydroxy-2-methyl propiophenone, p-t-butyl trichloroacetophenone, p-t-butyl dichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and mixtures thereof.

Examples of the benzophenone initiators may include benzophenone, benzoyl benzoate, methyl benzoylbenzoate, 4-phenyl benzophenone, hydroxybenzophenone, acrylated benzophenone, 4,4'-bis(dimethyl amino)benzophenone, 4,4'-dichlorobenzophenone, 3,3'-dimethyl-2-methoxybenzophenone, and mixtures thereof.

Examples of the thioxanthone initiators may include thioxanthone, 2-methyl thioxanthone, isopropyl thioxanthone, 2,4-diethylthioxanthone, 2,4-diisopropylthioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphorus initiators may include bis-benzoylphenyl phosphine oxide, benzoyl(diphenyl) phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof.

Instead of the aforementioned photopolymerization initiator, a carbazole, diketone, sulfonium, iodonium, diazo, or biimidazole photoacid generator, or photopolymerization initiator may be used.

The photopolymerization initiator may be present in an amount of about 0.1 parts by weight to about 20 parts by weight based on 100 parts by weight of the photocurable monomer and the photopolymerization initiator in the encapsulating composition. Within this range, the photopolymerization initiator allows sufficient photopolymerization of the photocurable composition without deterioration in transmittance due to unreacted initiator remaining after photopolymerization. Specifically, the photopolymerization initiator may be present in an amount of about 0.5 parts by weight to about 10 parts by weight, more specifically about 1 part by weight to about 8 parts by weight. Within this range, the photopolymerization initiator allows sufficient photopolymerization of the photocurable composition without deterioration in transmittance due to unreacted initiator remaining after photopolymerization.

According to another embodiment, the encapsulating composition may include the photocurable monomer, the photopolymerization initiator, and an antioxidant. The components of the encapsulating composition according to this embodiment are substantially the same as those of the encapsulating composition according to the above embodiment excluding the antioxidant.

The antioxidant can improve thermal stability of an encapsulation layer. The antioxidant may include at least one of among phenol, quinone, amine, and phosphite antioxidants, without being limited thereto. For example, the antioxidant may include tetrakis[methylene(3,5-di-t-butyl-4-hydroxyhydrocinnamate)]methane, tris(2,4-di-tert-butyl phenyl)phosphite, and the like.

The antioxidant may be present in an amount of about 0.01 parts by weight to about 3 parts by weight, specifically about 0.01 parts by weight to about 1 part by weight based on 100 parts by weight of the photocurable monomer and the photopolymerization initiator in the encapsulating composition. Within this range, the composition can exhibit excellent thermal stability.

According to a further embodiment, the encapsulating composition may include the photocurable monomer, the photopolymerization initiator, and a heat stabilizer. The components of the encapsulating composition according to this embodiment are substantially the same as those of the encapsulating composition according to the above embodiment excluding the heat stabilizer. As a result, the encapsulating composition according to this embodiment can suppress change in viscosity at room temperature. In addition, the encapsulating composition according to this embodiment can exhibit higher light transmittance, higher photocuring rate and lower plasma etching rate than compositions for encapsulation materials which do not include the heat stabilizer. The components of the encapsulating composition according to this embodiment are the same as those of the composition according to the above embodiment excluding the heat stabilizer. Therefore, only the heat stabilizer will be described in detail hereinafter.

The heat stabilizer is included in the encapsulating composition to suppress change in viscosity at room temperature, and may include any typical heat stabilizer without limitation. In some embodiments, the heat stabilizer may be a sterically hindered phenolic heat stabilizer. Specifically, the heat stabilizer may include at least one of poly(dicyclopentadiene-co-p-cresol), octadecyl-3-(3,5-di-tert-butyl-4-hydroxyphenyl)propionate, 2,6-di-tert-butyl-4-methylphenol, 2,2'-methano-bi(4-methyl-6-tert-butyl-phenol), 6,6'-di-tert-butyl-2,2'-thiodi-p-cresol, tris(4-tert-butyl-3-hydroxy-2,6-dimethylbenzyl)isocyanurate, triethylene glycol-bis(3-tert-butyl-4-hydroxy-5-methylphenyl), 4,4'-thiobis(6-tert-butyl-m-cresol), 3,3'-bis(3,5-di-tert-butyl-4-hydroxyphenyl)-N,N'-hexamethylene-dipropionamide, pentaerythritol tetrakis(3-(3,5-di-tert-butyl-4-hydroxyphenyl)propionate), stearyl-3,5-di-tert-butyl-4-hydroxyphenylpropionate, pentaerythritoltetrakis 1,3,5-tris(2,6-di-methyl-3-hydroxy-4-tert-butyl-benzyl)isocyanurate, 1,3,5-tris(3,5-di-tert-butyl-4-hydroxybenzyl)isocyanurate, and 1,3,5-tris (2-hydroxyethyl)isocyanurate-tris(3,5-di-tert-butylhydroxyphenylpropionate), without being limited thereto.

The heat stabilizer may be present in an amount of 2,000 ppm or less, for example, about 0.01 ppm to about 2,000 ppm, for example, about 100 ppm to about 1,000 ppm, based on the total weight of the photocurable monomer and the photopolymerization initiator in the encapsulating composition in terms of solid content. Within this range, the heat stabilizer can further improve storage stability and processability of the encapsulating composition in a liquid state.

The encapsulating composition according to the embodiments may be cured by UV irradiation at about 10 mW/cm$^2$ to about 500 mW/cm$^2$ for 1 second to 100 seconds, without being limited thereto.

The encapsulating composition according to the embodiments can realize an organic layer that has a plasma etching rate of about 400 nm/min or less as calculated by Equation 1 and a surface roughness of about 2 nm or less.

$$\text{Plasma etching rate (nm/min)} = (T0-T1)/M, \quad \text{<Equation 1>}$$

(where in Equation 1, T0 is an initial thickness (unit: nm) of a sample obtained by spray coating the encapsulating composition on a substrate, followed by curing through UV irradiation at 100 mW/cm$^2$ for 10 seconds; T1 is the thickness (unit: nm) of the sample subjected to plasma treatment under conditions of ICP power: 2500 W, RF power: 300 W, DC bias: 200 V, Ar flux: 50 sccm, and pressure: 10 mTorr for 1 minute; and M is plasma treatment time (unit: min). Here, each of T0 and T1 indicates a thickness of the sample excluding the thickness of the substrate).

Within this range, upon formation of an organic layer on an organic light emitting diode or on an inorganic layer covering the organic light emitting diode, the composition can secure a significantly low plasma etching rate of the organic layer by plasma treatment, thereby providing an organic protective layer exhibiting high plasma resistance. Specifically, the plasma etching rate may be about 400 nm/min or less, specifically about 10 nm/min to about 390 nm/min, about 10 nm/min to about 385 nm/min. If the plasma etching rate calculated by Equation 1 exceeds 400 nm/min, the organic layer can be further damaged, thereby deteriorating reliability of the organic light emitting diode.

As used herein, the surface roughness refers to deposition surface roughness obtained by measuring surface unevenness upon deposition of the encapsulating composition onto a substrate, and lower surface roughness can provide further improved flatness of a display.

As used herein, the surface roughness may be measured by a typical method known to those skilled in the art. For example, the surface roughness may be measured using an atomic force microscope (AFM). In some embodiments, upon measurement using the atomic force microscope (AFM), the encapsulating composition may provide a surface roughness (deposition surface roughness) of about 2 nm or less, about 0 nm to about 2 nm, 0 nm to about 1.9 nm, about 0 nm to about 1.85 nm. If the encapsulating composition provides a surface roughness of about 2 nm or less, the composition can form an organic layer having a flat surface and can permit deposition of a flat inorganic layer after deposition of the organic layer. If the encapsulating composition provides a surface roughness of greater than about 2 nm, the composition can form an uneven organic layer and can cause breakage of an inorganic layer formed on the organic layer.

The encapsulating composition according to the embodiments of the invention can provide an organic layer having an outgassing amount of about 2,000 ppm or less. Within this range, the encapsulating composition can improve reliability of a light emitting device by increasing lifespan of a member for the device. Specifically, the encapsulating composition according to the embodiments can provide an organic layer having an outgassing amount of about 10 ppm to about 1000 ppm.

Outgassing amount can be measured by a typical method. For example, the encapsulating composition is deposited onto a glass substrate and cured through UV irradiation at 100 mW/cm$^2$ for 10 seconds to prepare a specimen having a coating thickness of 5 µm. Then, outgassing amount is measured with respect to a predetermined area (1×5 cm$^2$) of the 5 µm thick coating using TD-GC/MS equipment (TD: JTD505III, GC/MS: Clarus 600, Perkin Elmer Co., Ltd.) by collecting outgas generated upon heating at a rate of 10° C./min from 40° C. to 320° C.

The encapsulating composition according to the embodiments can provide an organic layer having a color coordinate YI of about 0.5 or less (ASTM D1925) after curing. Within this range, the composition can form a transparent encapsulation material and allows transmission of substantially white light therethrough when applied to a display. Specifically, the encapsulating composition according to the embodiments can provide an organic layer having a color coordinate YI of about 0.1 to about 0.5.

Color coordinates can be measured by a typical method. For example, the encapsulating composition is deposited onto a glass substrate and cured through UV irradiation at 100 mW/cm$^2$ for 10 seconds to prepare a specimen having a coating thickness of 5 µm. Then, the color coordinate YI (in accordance with ASTM D1925) is calculated after measuring transmittance of the 5 µm thick coating using a UV-visible spectrophotometer (UV-2450, SHIMADZU Corporation) at a wavelength of 300 nm to 800 nm.

The encapsulating composition has a total light transmittance of 90% to 100%, specifically 95% to 100% and thus can provide a transparent organic protective layer. Total light transmittance and haze can be measured using a haze meter (NDH-5000, Nippon Denshoku Co., Ltd.) at a wavelength of 400 nm to 700 nm in accordance with ASTM D1003-95.

The encapsulating composition according to the embodiments of the invention is deposited on a luminous front side and required to be transparent instead of exhibiting a color. When an encapsulation material exhibits a color, light emitted from a light source of a display and transmitted through the encapsulation material deposited on the luminous front side provides deviated color coordinates, thereby causing distortion of colors. Moreover, lower transparency provides further deteriorated efficiency of light emitted through the front side, thereby causing the display to appear unclear.

Although not shown in FIG. 1, the organic light emitting diode display apparatus 100 may include a drive circuit for driving the organic light emitting diode 120. In some embodiments, although not shown in FIG. 1, the organic light emitting diode display apparatus may further include a thin film transistor (TFT) layer and a buffer layer between the substrate 110 and the organic light emitting diode 120. The TFT layer drives the organic light emitting diode and may include a gate line, a data line, a drive power line, a reference power line, and a capacitor.

In some embodiments, although not shown in FIG. 1, the organic light emitting diode display apparatus may further include a bonding layer covering the encapsulation layer and a substrate bonded to the bonding layer to encapsulate the organic light emitting diode. The bonding layer may be a transparent bonding film. The bonding layer and the substrate may be formed of a typical material known to those skilled in the art.

Next, an organic light emitting diode display apparatus according to another embodiment of the present invention will be described with reference to FIG. 2.

Referring to FIG. 2, an organic light emitting diode display apparatus 200 according to this embodiment includes a substrate 110, an organic light emitting diode 120, and an encapsulation layer 130', which encapsulates the organic light emitting diode 120.

In the organic light emitting diode display apparatus 200 according to this embodiment, the encapsulation layer 130' includes a first inorganic layer 131, a first organic layer 132, a second inorganic layer 133, a second organic layer 134, and a third inorganic layer 135. In this embodiment, the second inorganic layer 133 is formed to contact at least a portion of the third inorganic layer 135, and the second organic layer 134 is disposed within a region between the second inorganic layer 133 and the third inorganic layer 135.

Next, a method of fabricating an organic light emitting diode display apparatus according to one embodiment of the present invention will be described.

The method of fabricating an organic light emitting diode display apparatus according to one embodiment of the invention may include forming an organic light emitting diode on a substrate, and forming an encapsulation layer in which inorganic layers and organic layers are alternately formed on the organic light emitting diode, wherein the organic layers may be formed of the encapsulating composition according to the embodiments of the present invention.

First, an organic light emitting diode is formed on a substrate. Specifically, a cathode is formed on the substrate; and a light emitting layer and other layers are formed thereon by dry coating, such as vacuum deposition, sputtering, plasma plating and ion plating, or wet coating, such as spin coating, dipping and flow coating, followed by formation of an anode thereon, thereby forming an organic light emitting diode on the substrate.

The inorganic layers may be formed by any suitable vacuum process including sputtering, evaporation, sublimation, CVD, PECVD, ECR-PECVD (electron cyclotron resonance plasma enhanced chemical vapor deposition), and combinations thereof, without being limited thereto. The organic layers may be formed by any method such as deposition, spin coating, printing, inkjet printing, and spraying, without being limited thereto.

MODE FOR INVENTION

Next, the present invention will be described in more detail with reference to some examples. It should be understood that these examples are provided for illustration only and are not to be construed in any way as limiting the present invention.

Preparative Example 1

In a 3000 ml flask provided with a cooling tube and a stirrer, 300 ml of dichloromethane (Sigma Aldrich Co. Ltd.), 200 g of 4-hydroxybutyl acrylate (Shin Nakamura Chemical Co., Ltd.), and 168 g of triethylamine were placed, followed by cooling the flask to 0° C. and stirring for 2 hours while dropwise adding a solution obtained by dissolving 278 g of p-toluene sulfonyl chloride (Sigma Aldrich Co. Ltd.) in 500 ml of dichloromethane thereto. After additional stirring for 5 hours, residual solvents were removed by distillation. 300 g of the obtained compound was placed into 1000 ml of acetonitrile (Sigma Aldrich Co. Ltd.), and then 220 g of potassium carbonate (Aldrich Co., Ltd.) and 141 g of 2-phenylphenol (Sigma Aldrich Co. Ltd.) were added thereto, followed by stirring at 80° C. Residual solvents and reaction residues were removed, thereby obtaining a compound represented by Formula 5. The obtained compound (weight average molecular weight: 296.36) had an HPLC purity of 93%.

<Formula 5>

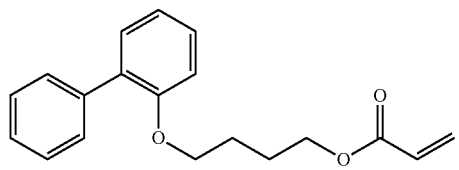

Preparative Example 2

In a 2000 ml flask provided with a cooling tube and a stirrer, 600 ml of dichloromethane (Sigma Aldrich Co., Ltd.), 58.8 g of 2-hydroxyethyl methacrylate (Sigma Aldrich Co., Ltd) and 52.2 g of trimethylamine (Sigma Aldrich Co., Ltd.) were placed, followed by stirring at 0° C. while slowly adding 100 g of triphenyl chloromethane (Sigma Aldrich Co., Ltd.). The flask was heated to 25° C., followed by stirring for 4 hours. Then, dichloromethane was removed through distillation, followed by performing silica gel column chromatography, thereby obtaining 124 g of a compound represented by Formula 6. The obtained compound had an HPLC purity of 97%.

<Formula 6>

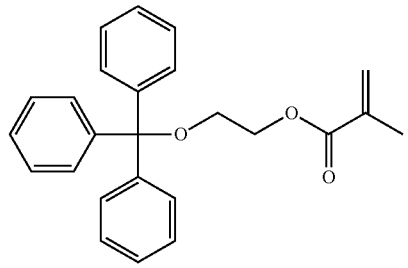

Preparative Example 3

In a 2000 ml flask provided with a cooling tube and a stirrer, 800 ml of acetonitrile (Fisher Co., Ltd.), 180 g of potassium carbonate (Aldrich Co., Ltd), and 108 g of acrylic acid were placed, followed by stirring at 0° C. while slowly adding 150 g of 4,4'-bis(chloromethyl) biphenyl (TCI Co., Ltd.). The flask was heated to 70° C., followed by stirring for 12 hours. Then, acetonitrile was removed through distillation, followed by performing silica gel column chromatography, thereby obtaining 177 g of a compound represented by Formula 7. The obtained compound had an HPLC purity of 97%.

<Formula 7>

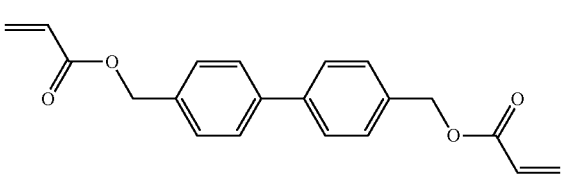

Preparative Example 4

In a 3000 ml flask provided with a cooling tube and a stirrer, 300 ml of dichloromethane (Sigma Aldrich Co. Ltd.), 200 g of 2-hydroxyethyl acrylate (Shin Nakamura Chemical Co., Ltd.), and 168 g of triethylamine were placed, followed by cooling the flask to 0° C. and stirring for 2 hours while dropwise adding a solution obtained by dissolving 278 g of p-toluene sulfonyl chloride (Sigma Aldrich Co. Ltd.) in 500 ml of dichloromethane thereto. After additional stirring for 5 hours, residual solvents were removed by distillation. 300 g of the obtained compound was placed into 1000 ml of acetonitrile (Sigma Aldrich Co. Ltd.), and then 220 g of potassium carbonate (Aldrich Co., Ltd.) and 141 g of 2-phenyl phenol (Sigma Aldrich Co. Ltd.) were added thereto, followed by stirring at 80° C. Residual solvents and reaction residues were removed, thereby obtaining a compound represented by Formula 8. The obtained compound (weight average molecular weight: 296.36) had an HPLC purity of 93%.

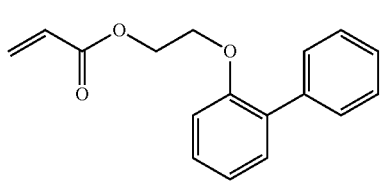
<Formula 8>

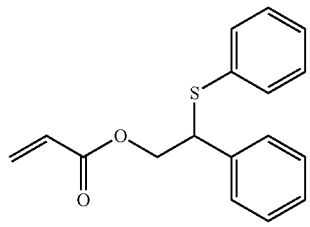
<Formula 10>

Preparative Example 5

In a 3000 ml flask provided with a cooling tube and a stirrer, 300 ml of dichloromethane (Sigma Aldrich Co. Ltd.), 400 g of 2-hydroxyethyl acrylate (Sigma Aldrich Co. Ltd.), and 168 g of triethylamine were placed, followed by cooling the flask to 0° C. and stirring for 2 hours while dropwise adding a solution obtained by dissolving 278 g of p-toluene sulfonyl chloride (Sigma Aldrich Co. Ltd.) in 500 ml of dichloromethane thereto. After additional stirring for 5 hours, residual solvents were removed through distillation. 300 g of the obtained compound was placed into 1000 ml of acetonitrile (Sigma Aldrich Co. Ltd.), and then 220 g of potassium carbonate (Aldrich Co., Ltd.) and 141 g of 2,2'-biphenol (Sigma Aldrich Co. Ltd.) were added thereto, followed by stirring at 80° C. Residual solvents and reaction residues were removed, thereby obtaining a compound represented by Formula 9. The obtained compound (weight average molecular weight: 382.41) had an HPLC purity of 91%.

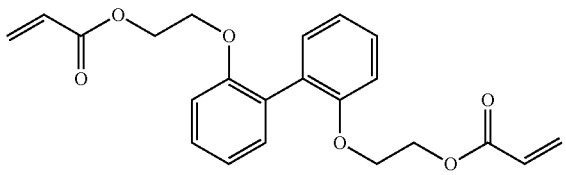
<Formula 9>

Preparative Example 6

In a 1000 ml flask provided with a cooling tube and a stirrer, 100 g of benzene thiol (Aldrich Co., Ltd.), 200 ml of dichloromethane (Sigma Aldrich Co., Ltd.) and 8.2 g of zinc perchlorate (Sigma Aldrich Co., Ltd.) were placed and stirred, followed by slowly dropwise adding 109.05 g of styrene oxide (Sigma Aldrich Co., Ltd.) at room temperature. After reaction for 4 hours, an inorganic material was removed using water and dichloromethane, followed by distillation of residual solvents, thereby obtaining 192 g of a primary compound. 150 g of the obtained primary compound, 70.31 g of triethylamine (Sigma Aldrich Co., Ltd.) and 500 ml of dichloromethane was stirred at 0° C., followed by slowly dropwise adding 64.84 g of acryloyl chloride (Sigma Aldrich Co., Ltd.). After dropwise addition, the flask was slowly heated to room temperature, followed by additional stirring for 4 hours. After completion of reaction, the resulting compound was purified using n-hexane (Daejung Chemicals & Metals Co., Ltd.) to remove salts and impurities, followed by removing residual solvents through distillation, thereby obtaining a compound represented by Formula 10. The obtained compound (weight average molecular weight: 284.37) had an HPLC purity of 85%.

Details of components used in Examples and Comparative Examples were as follows.

(A) Monomer containing no aromatic hydrocarbon group:
 (a1) Dodecanediol dimethacrylate (Satomer Chemical Co., Ltd.)
 (a2) Triethylene glycol dimethacrylate (BASF Co., Ltd.)
 (a3) Trimethylolpropane triacrylate (BASF Co., Ltd.)
 (a4) 2-dimethylaminoethyl acrylate (ACROS Co., Ltd.)

(B) Monomer having two or more substituted or unsubstituted phenyl groups:
 (b1) Monomer of Preparative Example 1
 (b2) Monomer of Preparative Example 2
 (b3) Monomer of Preparative Example 3
 (b4) Monomer of Preparative Example 4
 (b5) Monomer of Preparative Example 5
 (b6) Monomer of Preparative Example 6
 (b7) CP-011 (4-cumylphenoxyethyl acrylate, Hannong Chemicals Inc.)
 (b8) Bisphenol A dimethacrylate (Aldrich Co., Ltd.)
 (b9) BPM-102 (bisphenol A ethoxylated(10) dimethacrylate, Hannong Chemicals Inc.)
 (b10) Bisphenol F ethoxylated (2) diacrylate (Aldrich Co., Ltd.)

(C) Photopolymerization initiator: phosphorus initiator Darocur TPO (BASF Co., Ltd.)

Example 1

In a 125 ml brown polypropylene bottle, 90 parts by weight of (a1), 10 parts by weight of (b1) and 5 parts by weight of (C) were placed, followed by stirring for 3 hours using a shaker, thereby preparing an encapsulating composition of Example 1.

Examples 2 to 25 and Comparative Examples 1 to 15

Each of compositions for encapsulation materials was prepared in the same manner as in Example 1 except that the kinds and amounts of each component were changed as listed in Tables 1 and 4.

Evaluation of Properties (1) Plasma etching rate (%): Each of the photocurable compositions prepared in Examples and Comparative Examples was spray-coated onto a silicon wafer having a thickness of 525±25 nm, followed by UV curing through UV irradiation at 100 mW/cm² for 10 seconds, thereby forming a 5 μm thick organic protective layer specimen. The specimen was subjected to plasma treatment with argon gas under conditions of ICP power: 2500 W, RF power: 300 W, DC bias: 200 V, Ar flow: 50 sccm, pressure: 10 mTorr, and Plasma treating time: 1 min using an ICP dry etcher (Plasma lab system 133, Oxford Instruments). Plasma etching rate was calculated by the following equation after measuring the thickness T0 of the organic protective layer before plasma treatment and the thickness T1 of the organic protective layer after plasma treatment. Results are shown in Tables 1 to 4. Here, each of T0 and T1 indicates a thickness of the specimen excluding the substrate and M is a plasma treatment time (min).

Plasma etching rate (nm/min)=$(T0-T1)/M$ <Equation 1>

(2) Surface roughness (nm): After placing a specimen prepared as in (1) on an atomic force microscope (XE-100, Park systems Co., Ltd.), surface roughness was measured by setting a head mode to a contact mode under conditions of PSPD Display Window: A+B→1V, A−B→−500 mV to +500 mV.

(3) Color coordinate YI (ASTM D1925): Transmittance of a specimen prepared as in (1) was measured at a wavelength of 300 nm to 800 nm using a UV-visible spectrophotometer (UV-2450. SHIMADZU Co., Ltd.), followed by calculating color coordinate YI (ASTM D1925).

(4) Light transmittance (%): Total light transmittance of a specimen prepared as in (1) was measured in accordance with ASTM D1003-95 at a wavelength of 400 nm to 700 nm using a haze meter (NDH-5000, Nippon Denshoku Co., Ltd.).

TABLE 1

| Unit: Parts by weight | | 1 | 2 | 3 | 4 | 5 | 6 | 7 | 8 | 9 | 10 | 11 | 12 | 13 |
|---|---|---|---|---|---|---|---|---|---|---|---|---|---|---|
| (A) | (a1) | 90 | 80 | 70 | 60 | 60 | 60 | — | — | — | — | — | 60 | 60 |
|  | (a2) | — | — | — | — | — | — | 60 | 50 | — | — | — | — | — |
|  | (a3) | — | — | — | — | — | — | 20 | — | 30 | 30 | — | — | — |
|  | (a4) | — | — | — | — | — | — | — | 20 | 30 | 30 | 60 | — | — |
| (B) | (b1) | 10 | 20 | 30 | 40 | — | — | 20 | 30 | — | — | — | — | — |
|  | (b2) | — | — | — | — | 40 | — | — | — | 40 | — | 20 | — | — |
|  | (b3) | — | — | — | — | — | 40 | — | — | — | 40 | 20 | — | — |
|  | (b4) | — | — | — | — | — | — | — | — | — | — | — | 40 | — |
|  | (b5) | — | — | — | — | — | — | — | — | — | — | — | — | 40 |
|  | (b6) | — | — | — | — | — | — | — | — | — | — | — | — | — |
|  | (b7) | — | — | — | — | — | — | — | — | — | — | — | — | — |
|  | (b8) | — | — | — | — | — | — | — | — | — | — | — | — | — |
|  | (b9) | — | — | — | — | — | — | — | — | — | — | — | — | — |
|  | (b10) | — | — | — | — | — | — | — | — | — | — | — | — | — |
| (C) |  | 5 | 5 | 5 | 5 | 5 | 5 | 5 | 5 | 5 | 5 | 5 | 5 | 5 |
| Plasma etching rate (nm/min) | | 385 | 364 | 357 | 331 | 328 | 342 | 353 | 341 | 320 | 336 | 326 | 325 | 342 |
| Surface roughness (nm) | | 1.24 | 1.33 | 1.52 | 1.83 | 1.86 | 1.65 | 1.44 | 1.64 | 1.87 | 1.73 | 1.74 | 1.83 | 1.54 |
| Color index YI | | 0.41 | 0.41 | 0.41 | 0.41 | 0.4 | 0.42 | 0.41 | 0.41 | 0.42 | 0.42 | 0.41 | 0.41 | 0.41 |
| Light transmittance (%) | | 99 | 99 | 99 | 99 | 99 | 99 | 99 | 99 | 99 | 99 | 99 | 99 | 99 |

TABLE 2

| Unit: Parts by weight | | 14 | 15 | 16 | 17 | 18 | 19 | 20 | 21 | 22 | 23 | 24 | 25 |
|---|---|---|---|---|---|---|---|---|---|---|---|---|---|
| (A) | (a1) | 60 | — | — | — | — | — | 60 | 60 | 60 | 60 | — | — |
|  | (a2) | — | 50 | — | 60 | — | 30 | — | — | — | — | 70 | — |
|  | (a3) | — | — | 30 | — | 70 | — | — | — | — | — | — | 70 |
|  | (a4) | — | 20 | 30 | — | — | 30 | — | — | — | — | — | — |
| (B) | (b1) | — | — | — | — | — | — | — | — | — | — | — | 20 |
|  | (b2) | — | — | — | — | — | — | — | — | — | — | — | — |
|  | (b3) | — | — | — | 20 | — | — | — | — | — | — | — | — |
|  | (b4) | — | 30 | — | — | 20 | — | 35 | 35 | 35 | 35 | — | — |
|  | (b5) | — | — | 40 | 20 | — | 20 | — | — | — | — | 20 | — |
|  | (b6) | 40 | — | — | — | 10 | 20 | — | — | — | — | — | — |
|  | (b7) | — | — | — | — | — | — | 5 | — | — | — | — | — |
|  | (b8) | — | — | — | — | — | — | — | 5 | — | — | 10 | — |
|  | (b9) | — | — | — | — | — | — | — | — | 5 | — | — | — |
|  | (b10) | — | — | — | — | — | — | — | — | — | 5 | — | 10 |
| (C) |  | 5 | 5 | 5 | 5 | 5 | 5 | 5 | 5 | 5 | 5 | 5 | 5 |
| Plasma etching rate (nm/min) | | 360 | 340 | 335 | 338 | 348 | 328 | 323 | 320 | 320 | 321 | 354 | 352 |
| Surface roughness (nm) | | 1.74 | 1.64 | 1.68 | 1.53 | 1.74 | 1.52 | 1.83 | 1.82 | 1.83 | 1.82 | 1.63 | 1.64 |
| Color index YI | | 0.43 | 0.42 | 0.41 | 0.41 | 0.42 | 0.42 | 0.42 | 0.42 | 0.42 | 0.42 | 0.42 | 0.42 |

TABLE 2-continued

| Unit: Parts by weight | Example | | | | | | | | | | | |
|---|---|---|---|---|---|---|---|---|---|---|---|---|
| | 14 | 15 | 16 | 17 | 18 | 19 | 20 | 21 | 22 | 23 | 24 | 25 |
| Light transmittance (%) | 100 | 99 | 99 | 99 | 99 | 99 | 99 | 99 | 99 | 99 | 99 | 99 |

TABLE 3

| Unit: Parts by weight | | Comparative Example | | | | | | | |
|---|---|---|---|---|---|---|---|---|---|
| | | 1 | 2 | 3 | 4 | 5 | 6 | 7 | 8 |
| (A) | (a1) | 100 | 50 | 60 | 95 | — | — | — | — |
| | (a2) | — | — | 40 | — | 40 | — | — | 50 |
| | (a3) | — | — | — | 5 | — | 20 | — | — |
| | (a4) | — | — | — | — | — | 20 | 40 | — |
| (B) | (b1) | — | 50 | — | — | 60 | — | — | — |
| | (b2) | — | — | — | — | — | — | 30 | 20 |
| | (b3) | — | — | — | — | — | 60 | 30 | — |
| | (b4) | — | — | — | — | — | — | — | 30 |
| | (b5) | — | — | — | — | — | — | — | — |
| | (b6) | — | — | — | — | — | — | — | — |
| | (b7) | — | — | — | — | — | — | — | — |
| | (b8) | — | — | — | — | — | — | — | — |
| | (b9) | — | — | — | — | — | — | — | — |
| | (b10) | — | — | — | — | — | — | — | — |
| (C) | | 5 | 5 | 5 | 5 | 5 | 5 | 5 | 5 |
| Plasma etching rate (nm/min) | | 418 | 327 | 610 | 820 | 280 | 314 | 308 | 312 |
| Surface roughness (nm) | | 1.14 | 2.16 | 1.24 | 1.22 | 3.42 | 2.43 | 3.13 | 2.24 |
| Color index YI | | 0.41 | 0.41 | 0.41 | 0.41 | 0.45 | 0.46 | 0.44 | 0.41 |
| Light transmittance (%) | | 99 | 99 | 99 | 99 | 99 | 99 | 99 | 99 |

TABLE 4

| Unit: Parts by weight | | Comparative Example | | | | | | |
|---|---|---|---|---|---|---|---|---|
| | | 9 | 10 | 11 | 12 | 13 | 14 | 15 |
| (A) | (a1) | — | — | 50 | — | — | 30 | — |
| | (a2) | — | — | — | — | 30 | — | — |
| | (a3) | 30 | — | — | 50 | — | — | 50 |
| | (a4) | — | 40 | — | — | 20 | 20 | — |
| (B) | (b1) | — | — | — | — | — | — | 30 |
| | (b2) | — | — | — | — | — | — | — |
| | (b3) | — | — | — | — | — | — | — |
| | (b4) | 40 | — | — | — | — | — | — |
| | (b5) | 30 | 30 | — | — | 30 | — | — |
| | (b6) | — | 30 | — | 30 | — | 30 | — |
| | (b7) | — | — | 50 | 20 | — | — | — |
| | (b8) | — | — | — | — | 20 | — | — |
| | (b9) | — | — | — | — | — | — | 20 |
| | (b10) | — | — | — | — | — | 20 | — |
| (C) | | 5 | 5 | 5 | 5 | 5 | 5 | 5 |
| Plasma etching rate (nm/min) | | 296 | 310 | 324 | 318 | 287 | 320 | 322 |
| Surface roughness (nm) | | 3.35 | 3.14 | 2.54 | 2.43 | 3.65 | 2.44 | 2.42 |
| Color index YI | | 0.41 | 0.43 | 0.46 | 0.45 | 0.48 | 0.45 | 0.45 |

TABLE 4-continued

| Unit: Parts by weight | Comparative Example | | | | | | |
|---|---|---|---|---|---|---|---|
| | 9 | 10 | 11 | 12 | 13 | 14 | 15 |
| Light transmittance (%) | 99 | 100 | 99 | 99 | 95 | 99 | 99 |

From the results of Tables 1 to 4, the compositions of Examples had low plasma etching rates to provide significantly improved plasma resistance and a surface roughness of 2 nm or less to provide excellent flatness. Furthermore, the compositions of Examples provided a color coordinate YI (ASTM D1925) of 0.50 or less and high light transmittance to provide a transparent organic layer. Conversely, the compositions of Comparative Examples had higher etching rates or higher surface roughness than the compositions of Examples.

That is, the encapsulating composition used in an organic light emitting diode display apparatus according to the present invention could realize an organic layer having high plasma resistance and low surface roughness to secure excellent flatness. Accordingly, in the structure wherein the organic light emitting diode display apparatus according to the present invention is disposed between such an organic layer and an inorganic layer, the inorganic layer has low surface roughness, thereby enabling formation of a flat thin encapsulation layer.

Furthermore, the encapsulating composition used in the organic light emitting diode display apparatus according to the present invention exhibited high plasma resistance to provide better effects in prevention of damage due to external factors than the compositions of Comparative Examples, thereby providing excellent durability to the organic light emitting diode display apparatus.

Although some embodiments have been described herein, it should be understood that these embodiments are given by way of illustration only, and that various modifications, variations and alterations can be made by those skilled in the art without departing from the spirit and scope of the invention. Therefore, it should be understood that the above embodiments are provided for illustration only and are not to be construed as limiting the present invention.

The invention claimed is:

1. An organic light emitting diode display apparatus, comprising:
 a substrate;
 an organic light emitting diode disposed on the substrate; and
 an encapsulation layer encapsulating the organic light emitting diode, wherein the encapsulation layer has a structure in which two or more inorganic layers and one or more organic layers are alternately stacked one above another, two adjacent inorganic layers of the two or more inorganic layers at least partially contacting each other, and the one or more organic layers being formed of an encapsulating composition, the encapsulating composition comprising a photocurable monomer and a photopolymerization initiator,
 wherein:
 the photocurable monomer comprises:
  about 55 wt % to about 95 wt % of at least one of an amine group-containing mono(meth)acrylate, a substituted or unsubstituted $C_1$ to $C_{20}$ alkylene group-containing di(meth)acrylate, an ethylene oxide group-containing di(meth)acrylate, an ethylene oxide group-containing tri(meth)acrylate, and trimethylolpropane tri(meth)acrylate as a first monomer containing no aromatic hydrocarbon group; and
  about 5 wt % to about 45 wt % of a second monomer having two or more substituted or unsubstituted phenyl groups represented by Formula 1,

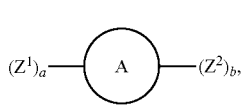
<Formula 1> wherein, in Formula 1,
A is a hydrocarbon having two or more substituted or unsubstituted phenyl groups, or a hetero atom-containing hydrocarbon having two or more substituted or unsubstituted phenyl groups;
$Z^1$ and $Z^2$ are each independently a compound represented by Formula 2; and
a and b are each independently an integer from 0 to 2 and a+b is an integer from 1 to 4;

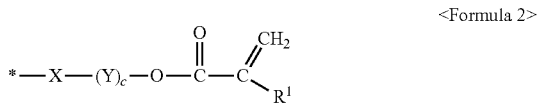
<Formula 2> wherein, in Formula 2,
* is a link site to a carbon of A in Formula 1;
X is a single bond, O, or S;
Y is a substituted or unsubstituted $C_1$ to $C_{10}$ linear alkylene group or a substituted or unsubstituted $C_1$ to $C_{20}$ alkoxylene group;
$R^1$ is hydrogen or a $C_1$ to $C_5$ alkyl group; and
c is 0 or 1;
wherein at least one of the one or more organic layers has a surface roughness of about 2 nm or less.

2. The organic light emitting diode display apparatus according to claim 1, wherein the two or more inorganic layers comprise a first inorganic layer and a second inorganic layer; the one or more organic layers comprise a first organic layer; and the encapsulation layer comprises the first inorganic layer, the first organic layer, and the second inorganic layer alternately stacked one above another.

3. The organic light emitting diode display apparatus according to claim 2, wherein the encapsulation layer has a structure in which the first inorganic layer and the second inorganic layer are sequentially stacked at an edge thereof.

4. The organic light emitting diode display apparatus according to claim 2, wherein the first inorganic layer and the second inorganic layer have the same area.

5. The organic light emitting diode display apparatus according to claim 2, wherein the second inorganic layer is formed to surround the first organic layer.

6. The organic light emitting diode display apparatus according to claim 1, wherein the two or more inorganic layers have the same area or a gradually increasing area with increasing distance from the organic light emitting diode.

7. The organic light emitting diode display apparatus according to claim 1, wherein each of the one or more organic layers has a thickness of about 0.2 μm to about 15 μm.

8. The organic light emitting diode display apparatus according to claim 1, wherein the two or more inorganic layers comprise at least one of silicon oxide, silicon nitride, silicon oxynitride, ZnSe, ZnO, $Sb_2O_3$, $Al_2O_3$, $In_2O_3$, and $SnO_2$.

9. The organic light emitting diode display apparatus according to claim 1, wherein the second monomer having two or more substituted or unsubstituted phenyl groups is one or more of a mono(meth)acrylate and a di(meth)acrylate.

10. The organic light emitting diode display apparatus according to claim 9, wherein:
the second monomer having two or more substituted or unsubstituted phenyl groups is a mono(meth)acrylate; and
the mono(meth)acrylate is a compound represented by Formula 3:

<Formula 3> wherein, in Formula 3,
$R^2$ is hydrogen or a methyl group;
$R^3$ is a substituted or unsubstituted $C_1$ to $C_{10}$ linear alkylene group, or a substituted or unsubstituted $C_1$ to $C_{20}$ alkoxylene group; and
$R^4$ is a hydrocarbon having two or more substituted or unsubstituted phenyl groups or a hetero atom-containing hydrocarbon having two or more substituted or unsubstituted phenyl groups.

11. The organic light emitting diode display apparatus according to claim 9, wherein:
the second monomer having two or more substituted or unsubstituted phenyl groups is a di(meth)acrylate; and
the di(meth)acrylate is a compound represented by Formula 4:

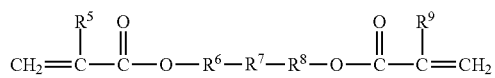
<Formula 4> wherein, in Formula 4,
$R^5$ and $R^9$ are each independently hydrogen or a methyl group;
$R^6$ and $R^8$ are each independently a substituted or unsubstituted $C_1$ to $C_{10}$ linear alkylene group, or a substituted or unsubstituted $C_1$ to $C_{20}$ alkoxylene group; and
$R^7$ is a hydrocarbon having two or more substituted or unsubstituted phenyl groups or a hetero atom-containing hydrocarbon having two or more substituted or unsubstituted phenyl groups.

12. The organic light emitting diode display apparatus according to claim 1, wherein the second monomer having two or more substituted or unsubstituted phenyl groups includes 4-(meth)acryloxy-2-hydroxybenzophenone, ethyl-3,3-diphenyl (meth)acrylate, benzoyloxyphenyl (meth)acrylate, bisphenol A di(meth)acrylate, ethoxylated bisphenol A di(meth)acrylate, bisphenol F di(meth)acrylate, ethoxylated bisphenol F di(meth)acrylate, 4-cumylphenoxyethyl (meth)acrylate, ethoxylated bisphenylfluorene di(meth)acrylate, 2-phenylphenoxyethyl (meth)acrylate, 2,2'-phenylphenoxyethyl di(meth)acrylate, 2-phenylphenoxypropyl (meth)acrylate, 2,2'-phenylphenoxypropyl di(meth)acrylate, 2-phenylphenoxybutyl (meth)acrylate, 2,2'-phenylphenoxybutyl di(meth)acrylate, 2-(3-phenylphenyl)ethyl (meth)acrylate, 2-(4-benzylphenyl)ethyl (meth)acrylate, 2-phenyl-2-(phenylthio)ethyl (meth)acrylate, 2-(triphenylmethyloxy)ethyl (meth)acrylate, 4-(triphenylmethyloxy)butyl (meth)acrylate, 3-(biphenyl-2-yloxy)butyl (meth)acrylate, 2-(biphenyl-2-yloxy)butyl (meth)acrylate, 4-(biphenyl-2-yloxy)propyl (meth)acrylate, 3-(biphenyl-2-yloxy)propyl (meth)acrylate, 2-(biphenyl-2-yloxy)propyl (meth)acrylate, 4-(biphenyl-2-yloxy)ethyl (meth)acrylate, 3-(biphenyl-2-yloxy)ethyl (meth)acrylate, 2-(4-benzylphenyl)ethyl (meth)acrylate, 4,4'-di((meth)acryloyloxymethyl)biphenyl, 2,2'-di(2-(meth)acryloyloxyethoxy)biphenyl, or a mixture thereof.

13. The organic light emitting diode display apparatus according to claim 1, wherein, in Formula 1, A is a substituted or unsubstituted biphenyl group, a substituted or unsubstituted triphenylmethyl group, a substituted or unsubstituted terphenyl group, a substituted or unsubstituted biphenylene group, a substituted or unsubstituted terphenylene group, a substituted or unsubstituted quaterphenylene group, a substituted or unsubstituted 2-phenyl-2-(phenylthio)ethyl group, a substituted or unsubstituted 2,2-diphenylpropane group, a substituted or unsubstituted diphenylmethane group, a substituted or unsubstituted cumylphenyl group, a substituted or unsubstituted bisphenol F group, a substituted or unsubstituted bisphenol A group, a substituted or unsubstituted biphenyloxy group, a substituted or unsubstituted terphenyloxy group, a substituted or unsubstituted quaterphenyloxy group, or a substituted or unsubstituted quinquephenyloxy group.

14. The organic light emitting diode display apparatus according to claim 1, wherein the second monomer having two or more substituted or unsubstituted phenyl groups has a molecular weight of about 100 g/mol to about 1000 g/mol.

15. The organic light emitting diode display apparatus according to claim 1, wherein the photocurable monomer consists of C, H, O, and at least one element selected from among N and S.

16. The organic light emitting diode display apparatus according to claim 1, wherein the encapsulating composition further comprises a heat stabilizer.

* * * * *